United States Patent [19]

Colquitt, Jr. et al.

[11] Patent Number: 4,959,701
[45] Date of Patent: Sep. 25, 1990

[54] VARIABLE SENSITIVITY FLOATING GATE PHOTOSENSOR

[75] Inventors: Leroy Colquitt, Jr., Columbia; Fred R. Sutherland, Catonsville, both of Md.; Edward J. Boling, Newtown, Pa.

[73] Assignee: Westinghouse Electric Corp., Pittsburgh, Pa.

[21] Appl. No.: 345,871

[22] Filed: May 1, 1989

[51] Int. Cl.$^5$ ............................................. H01L 29/78
[52] U.S. Cl. ..................................... 357/24; 357/23.5; 357/30
[58] Field of Search ................ 357/23.5, 24, 24 LR, 357/24 M, 23.14, 30 D, 30 G, 30 I, 30 Q

[56] References Cited

U.S. PATENT DOCUMENTS

| | | | |
|---|---|---|---|
| 246,677 | 12/1885 | Takada | 357/23.5 |
| 3,808,476 | 4/1974 | McCann, Jr. | 357/24 |
| 4,166,223 | 8/1979 | Bluzer | 357/24 LR |
| 4,169,231 | 9/1979 | Nash et al. | 357/24 M |
| 4,216,574 | 8/1980 | Feist | 357/24 |
| 4,362,575 | 12/1982 | Wallace | 357/24 M |
| 4,417,264 | 11/1983 | Angle | 357/23.5 |
| 4,481,527 | 11/1984 | Chen et al. | 357/23.5 |
| 4,538,287 | 8/1985 | Roberts et al. | 377/60 |
| 4,603,426 | 7/1986 | Sauer | 357/24 M |
| 4,622,656 | 11/1986 | Kamiya et al. | 365/185 |
| 4,641,167 | 2/1987 | Nishizawa | 357/30 |
| 4,686,558 | 8/1987 | Adam | 357/42 |
| 4,866,497 | 9/1989 | Kosonocky | 357/30 C |

FOREIGN PATENT DOCUMENTS

| | | | |
|---|---|---|---|
| 0069777 | 4/1982 | Japan | 357/24 M |
| 0296268 | 12/1988 | Japan | 357/24 |

OTHER PUBLICATIONS

Heyns et al., "The Resistive Gate CTD Area Image Sensor", IEEE, vol. ED-25, No. 2, Feb., 1978.
Erb et al., "An Overlapping Electrode Buried Channel CCD", Technical Digest, Dec. 3, 1973.

Primary Examiner—Rolf Hille
Assistant Examiner—Minhloan Tran
Attorney, Agent, or Firm—W. G. Sutcliff

[57] ABSTRACT

An improved floating gate photosensor is operable in either an enhanced voltage sensitivity mode or an enhanced transit speed mode. This photosensor has a floating gate assembly that includes two overlapping, independent and complementary-shaped gate electrodes connected to separate circuits as a means of controlling the depth of the channel in which the signal charge flows. As a result, the two key operating parameters of responsivity and signal transit time are variable. Structurally, each gate includes a plurality of prongs that overlap the recesses defined by the prongs of the other electrode. The photosensor may be operated in the WC (side channel) mode where the two gate electrodes are both used as floating gate sensors. In this instance the photosensor operates like that of a conventional floating gate sensor, with the width of the channel equal to that of the entire floating gate assembly and the depth of the channel being about 4 microns below the surface of the device. The photosensor can also be operated in the NC (narrow channel) mode where only one of the gate electrodes is in the floating gate sensing mode while the other is biased so that the channels beneath its prongs act as barriers to signal charge flow, thereby restricting charge flow to a plurality of narrow channels under the fingers of the first gate which are only about one micron below the surface of the device.

21 Claims, 2 Drawing Sheets

VARIABLE SENSITIVITY FLOATING GATE PHOTOSENSOR

BACKGROUND OF THE INVENTION

This invention generally relates to floating gate semiconductor devices, and is specifically concerned with a floating gate photosensor operable in either an enhanced sensitivity mode or an enhanced transit speed mode.

Floating gate photosensors are known in the prior art. Generally, such photosensors are made up of three contiguous sections: a light gathering section where light impinging on the device is converted into photocharges which generate a signal current, a floating gate section which senses variations in the current of the photocharges, and a drain section which serves as a signal charge collection point. Structurally, these sensors are made up of photosensitive semiconductor material with an n-type (or p-type) buried channel over an opposite type substrate. The purpose of the buried channel is to provide a subsurface flow path for the signal charge. The depth of the channel is determined by the relative concentration of the n and p regions and the junction depth of the buried channel. The principal advantage of such a photosensor is its ability to detect a signal charge without destroying it, thereby leaving the signal charge intact for further processing.

While the foregoing device has proven to be satisfactory in many respects, the applicants have noted two major limitations in its design that impairs its overall usefulness. The first limitation arises from the fact that two important operating parameters, the responsivity and the signal transmit time (or equivalently, the bandwidth) are determined by the depth of the buried channel which is fixed at the time of manufacturing. Moreover, the device may have either a high responsivity or a high bandwidth (or low signal transit time), but not both as a high responsivity is achieved by having the signal flow channel close to the surface while a short signal transit time is achieved by having the signal flow channel far from the surface. Hence, it is difficult for a single photosensor device of this type to perform well in an environment where the light signals vary greatly in amplitude. If the light signals fall below a certain level of amplitude, then the voltage sensitivity of the device may not be adequate to process the resulting signal charge. Of course, such a device could be replaced with a photosensor whose flow channel was closer to the surface of the n-type outer region. However, the increase in voltage sensitivity would come at a price of an increase in the transit time required for the photocharges to traverse the n-type region before they enter the drain. Consequently, such a device would operate unnecessarily slowly to process light beam signals carried over relatively strong light beam intensities. A second limitation that the applicants have observed is that there have been, generally, two choices in the methods of constructing the resistive and floating gates, either of which had shortcomings. In the first method, one could use a single level to define the gate material. This meant that in order to isolate the resistive gate from the floating gate, a gap of several microns had to be inserted between the gates. This creates a potential pocket or well in the channel for signal charge flow which in turn, retards the response time of the detector at low signal levels. In the second method, a two level polysilicon process is used to define the gates. This allows one to overlap the gates and avoid the problem of an intergate potential pocket, while isolating the gates electrically. Unfortunately, such overlapping of the gates has been found to introduce an unacceptably large overlap capacitance between the gates. Moreover, using a two level polysilicon process increases the complexity of processing and decreases the processing yield.

Clearly, there is a need for a photosensor which may be operated in either a voltage sensitive mode or a low transit time mode so as to be able to optimally process signals carried over light beams of broadly varying intensities. Moreover, it would be desirable if such a photosensor had a means for eliminating the charge flow retarding potential well that exists between the resistive gate and the floating gate in prior art structures without the addition of unwanted capacitances.

SUMMARY OF THE INVENTION

Generally speaking, the invention is a floating gate photosensor operable in either an enhanced responsivity mode, or an enhanced transit speed mode that comprises first and second contiguous layers of photosensitive, semiconductor material of different conductivity types, and includes a drain means at one end for receiving a flow of charges produced when light strikes the first layer, and a floating gate assembly disposed on the first layer over the buried channel for detecting changes in the flow of the charges.

The floating gate is made up of an assembly of two overlapping, interdigitated, independent gates and biasing circuits. The first gate electrode preferably includes a plurality of prongs that defines a plurality of recesses therebetween. The second gate electrode is complementary in shape to the first gate electrode. The gate assemblies may be operated so that they are either both in a floating gate sensing mode, or so that only one is in a floating gate sensing mode while the other is operated so as to restrict the signal charge to flow through narrow channels defined by the sensing gate. The constriction of the width of the signal channel draws the signal charge closer to the silicon/dielectric interface and decreases the depth of the channel. This allows one to electronically control the depth at which the charges flow, thereby providing a device capable of either greater voltage sensitivity of greater operating speed. The device may also be operated in any one of an infinite number of intermediate modes by varying the relative biasing voltages applied to the first and second gate electrodes, which in turn varies the depth of the channel from its deepest, broadest position to its shallowest and narrowest position.

A resistive gate is preferably provided over the outer surface of the first semiconductor layer to bias the charges toward the drain and thereby shorten the transit time in either mode of operation. The resistive gate is preferably transparent so as not to interfere with the penetration of light into the photosensitive semiconductor material and the production of photo-generated charge therein.

Finally, the floating gate photosensor preferably uses a manufacturing process where the resistive and floating gates are on the same level and includes an antipotential well electrode disposed between and overlapping the resistive and floating gate assemblies. A thick layer of dielectric is used to electrically isolate this electrode from the resistive and floating gate assemblies and provide a small overlap capacitance. This improvement gives the detector a fast response time without imparting a large overlap capacitance or significantly increasing processing complexity (and hence reducing production yield).

BRIEF DESCRIPTION OF THE SEVERAL FIGURES

DETAILED DESCRIPTION OF THE PREFERRED EMBODIMENT

Figure 1A:
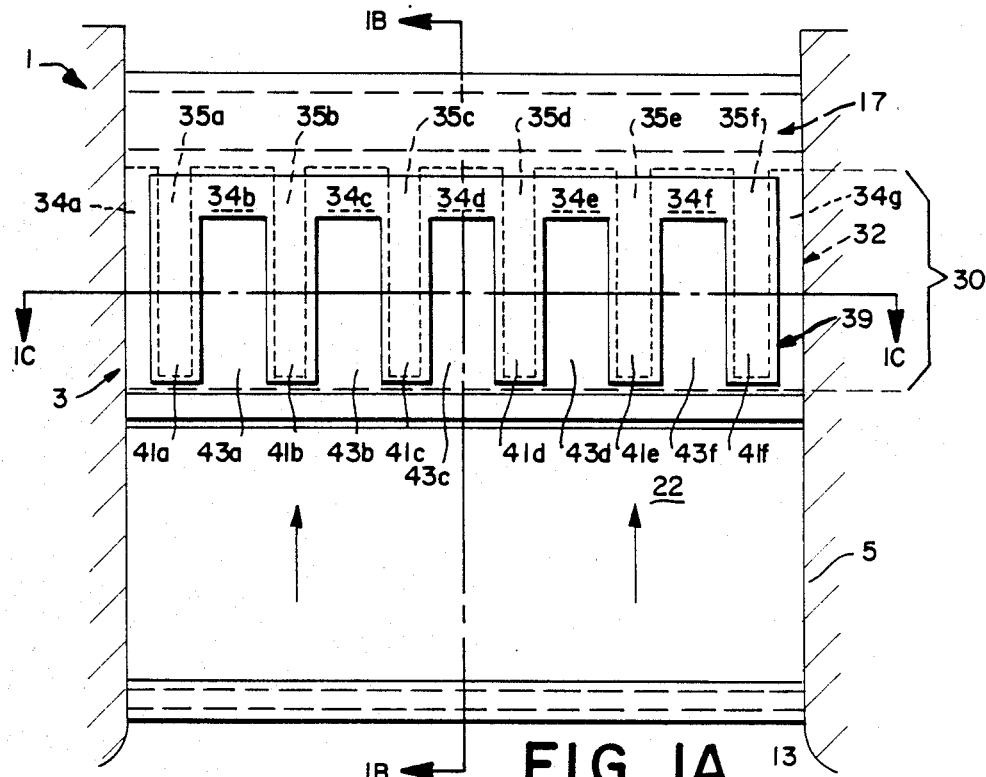
FIG. 1A is a plan view of the variable sensitivity floating gate photosensor of the invention.
Figure 1B:
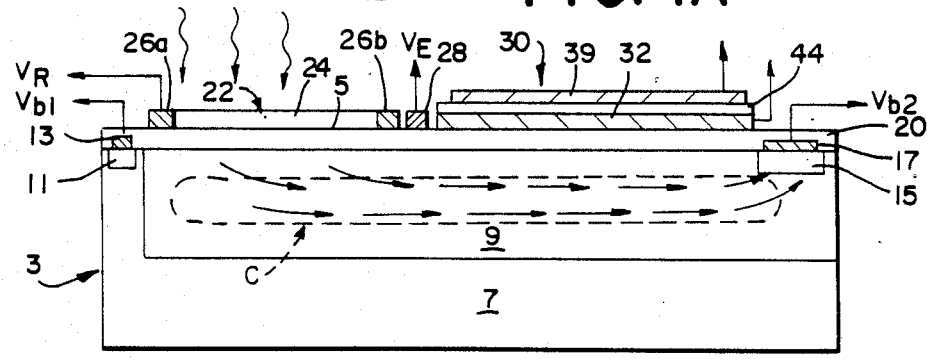
FIG. 1B is a cross-sectional side view of the photosensor illustrated in FIG. 1A along the line 1B—1B.
Figure 1C:
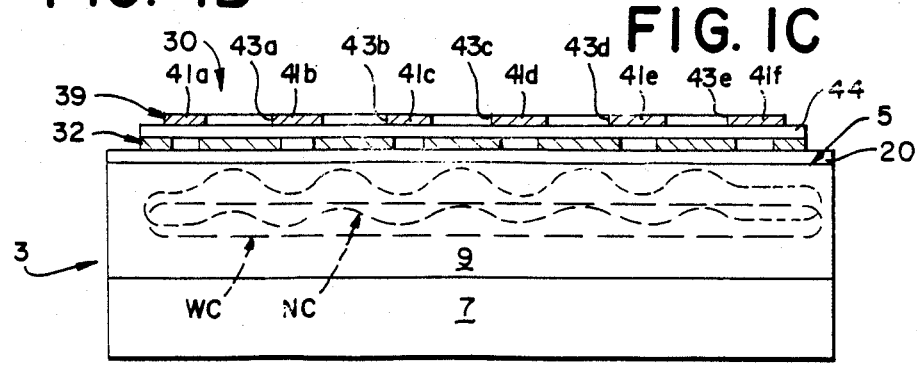
FIG. 1C is a cross-sectional view of the photosensor illustrated in FIG. 1A along the line 1C—1C.

With reference now to FIGS. 1A, 1B and 1C, the floating gate photosensor 1 of the invention is generally formed from a substrate of crystalline silicon. Of course, other common semiconductor material such as gallium arsinide may be used. The substrate 3 is generally planar as shown and has a light receiving outer surface 5. The inner region 7 of the substrate 3 is lightly doped with negatively charged atoms to a density of approximately $2 \times 10^{14}$ atoms per centimeter$^3$. The substrate 3 further includes an outer region 9 which overlies and junctions with the inner region 7.

The outer region 9 is made up of a 12 micron deep epitaxial layer positively doped to a concentration of $10^{14}$ atoms per centimeter$^3$ and a graded implant layer of approximately 1 micron thick and a concentration of $5.0 \times 10^{14}$ atoms per centimeter$^3$ to increase the charge handling capacity.

In this example of the invention, the depth of the outer region 9 relative to the surface 5 of the substrate 3 is approximately 4 microns. A substrate contact region 11 is provided along the upper edge of the lightly doped inner region 7. The substrate contact region 11 is formed by heavily doping this region with negatively charged atoms to a density of approximately $5 \times 10^{19}$ atoms per centimeter$^3$. A source electrode 13, which may be formed from aluminum, is disposed over the region 11 in electrical contact therewith. A drain region 15 is disposed along the upper edge of the outer region 9 directly opposite from the source region 11. Drain region 15 is formed by heavily doping this region with positively charged atoms to a density approximately $5 \times 10^{19}$ centimeters$^3$. A drain electrode 17 is disposed over the drain region 15 in electrical contact therewith. Both the substrate contract region 11 and the drain region 15 are formed by selective diffusion or selective ion implantation, while the aluminum source and drain electrodes 13 and 17 are formed by vacuum evaporated aluminum which is selectively etched into the shape shown. During the operation of the device, both the source and drain electrodes 13 and 17 are connectable to biasing voltages Vb1, Vb2 respectively.

An insulating layer of silicon dioxide 20 is deposited over the outer surface of the outer region 9 as shown in order to insulate the region 9 from the resistive gate 22, the anti-potential well (or gap control) electrode 28, and the floating gate assembly 30 which will be described directly. This insulative layer 20 is preferably only about one tenth of a micron in thickness.

The resistive gate 22 is preferably formed from a transparent layer of polysilicon 24 approximately 3 to 4 tenths of a micron in thickness. The transparency of this component prevents it from interfering with the transmission of light into the photosensitive regions 9 and 7. Metal electrodes 26a and 26b are provided along the edges of the polysilicon layer 24 as shown. Again. the electrodes 26a and 26b may be formed by vacuum evaporated aluminum which is selectively etched away. During the operation of the device, these electrodes 26a and 26b are connectable across the voltage Vr in order to create the ramp-shaped fringing field illustrated in FIG. 3 that hastens the transit of the photoelectrons collected in the outer region 9 into the drain region 15.

The anti-potential well electrode 28 is closely disposed between the opposing edges of the resistive gate 22, and the floating gate assembly 30. During the operation of the photosensor 1, a biasing voltage Ve is applied to this electrode 28 in order to eliminate a potential well which otherwise would be present in the fringing field projected into the outer region 9 by the resistive gate 22 and the floating gate assembly 30. As will be discussed in more detail hereinafter, the presence of the electrode 28 greatly shortens the transit time of the photoelectrons which flow through a channel in the outer region 9 into the drain region 15. This electrode 28 may likewise be formed from vacuum evaporated aluminum which is selectively etched away.

The floating gate assembly 30 includes a gate electrode 32 disposed directly over the silicon dioxide layer 20, as well as a barrier electrode 39 that overlies the gate electrode 32 and is complementary in shape thereto The gate electrode 32 includes seven rectangular fingers 34a through 34g as shown. These fingers 34a through 34g define six rectangular recesses 35a through 35f which are best seen in FIG. 1A. Like the gate electrode 32, the barrier electrode 39 likewise includes a plurality of fingers 41a through 41f as is best seen in FIG. 1C. These fingers in turn define rectangular recesses 43a through 43e. It is important to note that the recesses 35a through 35f of the gate electrode 32 are covered by the fingers 41a through 41f of the barrier electrode 39, and further that the rectangular recesses 43a through 43f of the barrier electrode 39 overlie the rectangular fingers 34b through 34f of the gate electrode 32. The important consequences of the complementary shape of the gate and barrier electrodes 32 and 39 will be explained shortly. An insulating layer of silicon dioxide 44 is disposed between the gate and barrier electrodes 32 and 39 in order to mutually insulate these electrodes 32 and 39 from one another.

Figure 2:
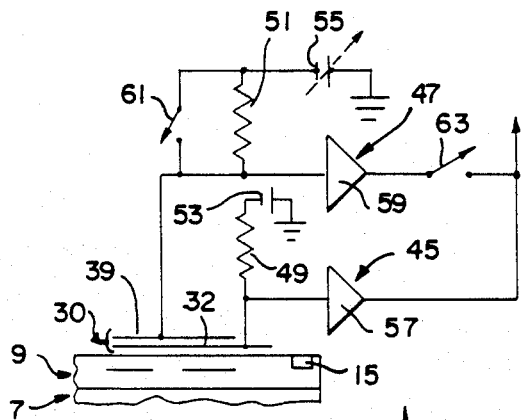
FIG. 2 is a schematic illustration of the two amplification and biasing circuits that are connected to the gate electrode and barrier electrode of the floating gate assembly.

FIG. 2 schematically illustrates the biasing and sensing circuits 45 and 47 which are connected to the gate electrode 32 and the barrier electrode 39, respectively. Each of these circuits 45,47 includes a high value resistor 49,51 serially connected to a DC voltage source 53,55 for setting an average potential on the floating gate assembly 30. In the preferred embodiment, each of the resistors 49 and 51 is approximately $10^{10}$ ohms. Connected in parallel with respect to the resistor 49,51 and voltage source 53,55 of each of the circuits 45 and 47 is an operational amplifier 57,59. The purpose of these operational amplifiers 57,59 is to detect changes in the potential of the electrodes 32 and 39 that is capacitively induced by changes in the flow of photoelectrons directly beneath the floating gate assembly 30. Each of these operational amplifiers 57,59 has an output sensing MOSFET whose signal is in turn amplified by other components. The biasing and sensing circuit 47 for the barrier electrode 39 includes switches 61 and 63 between its biasing voltage source 55 and the output of its operational amplifier 59 for a purpose which will become evident presently.

Figure 3:
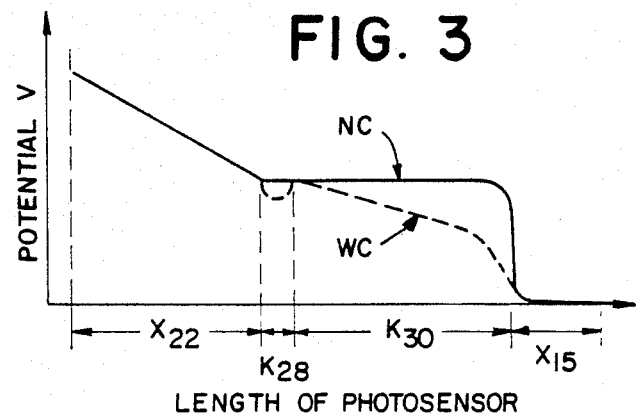
FIG. 3 is a graph illustrating how the voltage potential exerted onto the photoelectrons varies a these electrons traverse the device.

The operation of the variable sensitivity floating gate photosensor 1 will now be explained with reference to FIGS. 1B, 1C and 3. The photosensor 1 is operable in either one of two modes, which shall be designated a wide channel (WC) mode and a narrow channel (NC) mode. In either mode of operation, light passing through the transparent resistive gate 22 and striking regions 7 and 9 photo-generate electrons that are collected in region 9. These photoelectrons are drawn across the outer region 9 to the drain region 15 as indicated by the flow arrows of FIG. 1B. These photoelectrons do not flow uniformly throughout the cross section of the negatively doped outer region 9 in route to the drain region 15. Rather, they flow through a specific channel c in the outer region 9, the depth of which is determined by relative doping concentrations of the inner and outer regions 7 and 9. The depth of this channel is, of course, limited by the depth of the junction between regions 7 and 9. In the present example, the depth of the potential minimum which defines the center line of the channel is approximately 4 microns from the interface of region 9 and the silicon-dioxide region 20. In either the NC or WC mode of operation, the speed of transit of photoelectrons from the imaging area is hastened by the resistive gate 22. This may best be understood with specific reference to FIG. 3, which illustrates the relationship between electrical potential exerted on the photoelectrons by the photosensor 1 at various points along the length of the photosensor. In this graph, X22 represents the length of the photosensor 1 beneath the resistive gate 22, while K28 represents the length of the photosensor 1 beneath the anti-potential well electrode 28 and K30 represents the length beneath the floating gate assembly 30. Of course, X15 represents the length of the photosensor 1 beneath the drain region 15. As is evident from the graph of FIG. 3, the resistive gate 22 produces an electric field which exerts a force on the photoelectrons that draws them toward the drain region 15. Without the provision of such a resistive gate 22, the potential voltage experienced by the photoelectrons along the length X22 would be flat, and consequently electron diffusion would be the only mechanism tending to move the photoelectrons along toward the drain region 15. The ramp provided in the electrical field by the resistive gate 22 consequently substantially shortens the transit time of the photoelectrons across the photo-charge generation region. As is further evident in the graph of FIG. 3, the electrode 28 advantageously converts a trough in the fringing field into a plateau. Without the provision of the electrode 28, photoelectrons would tend to accumulate in this trough (indicated by a dotted line) and the negative charge accumulated in this trough and be lost from the signal. For low light levels this results in a serious signal distortion; for higher levels a delay in signal response times. The provision of the electrode 28 advantageously shortens the transit time of these photoelectrons by approximately an order of magnitude from what they otherwise would be.

When the photosensor 1 is operated in the NC mode, switch 61 of the biasing and sensing circuit 47 for the barrier electrode 39 is closed and switch 63 opened. In this mode of operation, only electrode 32 is in a sensing mode while the channel beneath gate electrode, 39, (i.e., that beneath the recesses 35a through 35f) experiences a large repulsive potential which precludes signal flow. As a result, signal flow is restricted to the channel or recesses under 34a through 34g. The fact that the width of the channel is small has a significant effect on the distance of the channel from the surface. Switch 63 of circuit 47 is opened to prevent noise from circuit 47 from affecting circuit 45.

Figure 4:
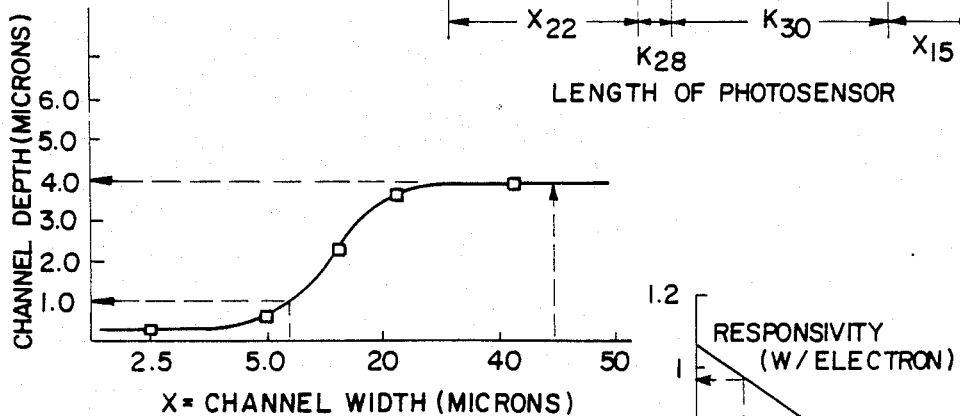
FIG. 4 is a graph illustrating the relationship between the depth of the charge conducting channel and the width of the channel.

Due to the narrow channel effect, each of the narrow channels induced in the photoelectron flow will rise closer to the outer surface 5 of the substrate 3. FIG. 4 graphically depicts the relationship between channel width and the resulting depth of the potential minimum of this channel from the outer surface 5. In the case of the photosensor structure having an overall width of approximately 100 microns, the width of the channel under the resistive gate 22 would be approximately 95 microns In the WC mode, when both gate electrodes 32 and 39 are floating in a sensing mode, the net channel width is large and the depth of the potential minimum of this channel is four microns in the region under the floating gate assembly 30 However, in the NC mode, the biasing of the gate electrode 32 breaks the single wide channel into a plurality of narrow channels (indicated in phantom by the finely-dotted line) which are closer to the outer surface 5 of the substrate 3. In the instant example, the net effect of the imposition of the narrow channels (i.e.. approximately 7.5 microns wide) is to reduce the potential minimum of the flow channel from four microns below the surface 5 to one micron. Because the flow of photoelectrons is now closer to the gate electrode 32, the overall voltage responsivity of the photosensor 1 is increased in accordance with the graph of FIG. 5. Specifically, as the average depth of the channel is decreased from 4 microns to one micron below the surface, the responsivity is increased from approximately 0.7 microvolts per electron to 0.95 microvolts per electron. Thus, overall responsivity is increased by a factor approximately 26%. However, in order to compute the overall increase in the voltage sensitivity of the device, the increase in the transit time of the photoelectrons underneath the gate electrode 32 must also be taken into account. This increase in transit time arises from the fact that, as the depth of the channel decreases, the fringing fields tending to drive the photoelectrons toward the drain region 15 tend to weaken in the vicinity between the edges of the resistive gate 22, and the floating gate assembly 30. As these fringing fields weaken, thermal diffusion becomes the dominant transportation mechanism for the photoelectrons as they drift into the drain region 15.

For example, for a 25 micron long floating gate, and a channel depth of 4 microns, the fringing fields have a range of approximately 5 microns, and the transit time of charge carriers over the gate are dominated by diffusion for 25 microns less 10 microns (5 microns from either end of the floating gate). On the other hand if the channel depth were 1 micron, the fringing field range is only approximately 2.5 microns and the diffusion length becomes 25 microns less 5 microns (2.5 microns from either end of the floating gate). As a result the transit time due to diffusion is increased by the ratio of (20/15) squared, or approximately 1.8.

Figure 5:
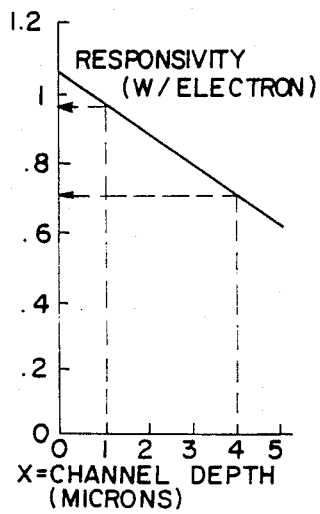
FIG. 5 is a graph illustrating how the responsivity of the photosensor of the invention varies with the depth of the potential minimum within the buried channel region of the device.

When this factor is multiplied times the percentage increase in responsivity obtained from the graph in FIG. 5, the overall increase in voltage sensitivity if obtained. In the instant example, the enhanced responsivity as a result of the decreased distance between the photoelectrons flow and the gate electrode 32 is 126% which, times the factor 1.8, yields an overall enhanced voltage sensitivity of about 227%. Of course, this increase in voltage sensitivity comes at the cost of an increased transit time, which is equal to the transit time multiplication factor of 1.8. Hence, an enhanced voltage sensitivity of 226% is obtained at a cost of an 80% increase in transit time.

When it is desired to operate the photosensor 1 in the WC mode, all that is necessary is to open the switch 61 and close the switch 63 of the biasing and sensing circuit 47 of the barrier electrode 39. In this mode both gate electrodes of assembly 30 are in a floating mode and capacitively sense the presence of a flow of signal changes in the channel. Signal charges flow under all of the recesses 34a through 34g and 35a 35f. The end result is that the photoelectrons will continue to flow in the same wide channel (indicate by a dashed line in FIG. 1C) that originate from underneath the resistive gate 22. In this mode the resulting transit time of the photoelectrons is reduced, while the overall voltage sensitivity of the photosensor 1 is, of course, also reduced.

As is indicated in phantom in FIG. 2, voltage source 55 may be variable so that the biasing voltage that the barrier electrode 39 exerts on the flow of photocharges may be varied, thereby allowing the operator to adjust the depth of the channel anywhere from between one and four microns below the outer surface 5 of the substrate 3. Such a variation in the depth of the channel will, of course, allow the photosensor 1 to be operated at any one of a number of compromise positions between enhanced voltage sensitivity and minimum photoelectron transit times.

We claim:

1. A floating gate semiconductor device operable in either an enhanced transit speed mode or an enhanced responsivity mode, comprising:
   first and second contiguous layers of semiconductor material of different conductivity types, wherein said first layer includes a drain means at one end for receiving a flow of charges, and a buried channel that directs said flow of charges along a selected depth within said first layer, and
   a floating gate assembly disposed over said buried channel for detecting changes in the flow of said charges, including a first gate electrode for selectively emanating an electric field that changes the width of the buried channel and hence varies the depth of the buried channel within the first layer when a biasing voltage is applied thereto to enhance either the transit speed of the charges or the responsivity of the device, and a second gate electrode adjacent to the first gate electrode for detecting changes in the flow of said charges.

2. A floating gate semiconductor device defined in claim 1, wherein said first gate electrode includes at least one recess that defines a channel narrowing electric field when said biasing voltage is applied to said first gate electrode.

3. A floating gate semiconductor device defined in claim 2, wherein said second gate electrode is complementary in shape to said first gate electrode and overlaps said first gate electrode.

4. A floating gate semiconductor device defined in claim 2, wherein said first gate electrode includes a plurality of prongs that define a plurality of said recesses.

5. A floating gate semiconductor device defined in claim 4, wherein said second gate electrode overlaps each of the recesses defined by said prongs, and said first and second gate electrodes are separated by an insulator.

6. A floating gate semiconductor device defined in claim 1, wherein said first and second layers are photosensitive.

7. A floating gate semiconductor device defined in claim 1, further comprising a resistive gate over said first layer for biasing said charges toward said drain means.

8. A floating gate semiconductor device defined in claim 7, further comprising a potential well control gate means disposed between the resistive gate and the floating gate assembly for neutralizing a potential well that exists between said floating gate assembly and said resistive gate.

9. A floating gate semiconductor device defined in claim 7, wherein said resistive gate is transparent to allow light to strike said first layer.

10. A floating gate semiconductor device defined in claim 1, wherein said first gate electrode operates as floating gate when no biasing voltage is applied thereto.

11. A floating gate photosensor operable in either an enhanced transit speed mode or an enhanced responsivity mode, comprising:
    first and second contiguous layers of semiconductor material of different conductivity types, wherein said first layer has an outer surface which is photosensitive and includes a drain means at one end for receiving a flow of charges produced when light strikes said first layer, and wherein the charges flow along a buried channel whose potential minimum is located at a selected depth within said first layer, and
    a floating gate assembly disposed on said first layer over said buried channel for detecting changes in the flow of said charges, including a first gate electrode for selectively emanating an electric field that renders said buried channel narrower and thus reduces the depth of the buried channel within said first layer when a biasing voltage is applied thereto to enhance the responsivity of the device at the expense of a slower transit speed for said charges through said buried channel, and a second gate electrode disposed adjacent to said first gate electrode for detecting changes in the flow of said charges beneath said assembly.

12. A floating gate photosensor as defined in claim 11, wherein said first gate electrode includes at least one recess that defines a channel narrowing electric field when a biasing voltage is applied to said first gate electrode.

13. A floating gate photosensor as defined in claim 12, wherein said second gate electrode is complementary in shape to said first gate electrode and overlaps said first gate electrode.

14. A floating gate photosensor as defined in claim 13, wherein said first gate electrode includes a plurality of prongs that define a plurality of said recesses.

15. A floating gate photosensor as defined in claim 14, wherein said second gate electrode includes a plurality of prongs, each of which overlaps one of the recesses defined by the prongs of the first gate electrode.

16. A floating gate photosensor as defined in claim 15, further including first and second layers of insulatory material disposed between said first and second gate electrodes and said floating gate assembly and said outer surface of said first semiconductor layer, respectively.

17. A floating gate photosensor as defined in claim 11, further comprising resistive a gate disposed over a portion of the outer surface of said first semiconductor layer for biasing said charges toward said drain, said resistive gate being formed from a transparent material so that light is conducted therethrough.

18. A floating gate photosensor as defined in claim 17, wherein said resistive gate is a polysilicon gate.

19. A floating gate photosensor as defined in claim 11, wherein said floating gate assembly varies the depth of said flow channel from between one and four microns with respect to the outer surface of said layer depending upon the magnitude of the biasing voltage applied to the first gate electrode.

20. A floating gate photosensor operable in either an enhanced transit speed mode or an enhanced responsivity mode, comprising
 a substrate of semiconductor material having an inner region and an outer region doped with differently charged impurities, wherein said regions generate charges when exposed to a beam of light, and said charges flow across said outer region in a buried channel whose potential minimum is located a selected depth within said first region;
 a resistive gate means disposed over said outer region for biasing said flow of charges toward a drain means, said resistive gate means being formed from a transparent material;
 a floating gate assembly disposed over said buried channel for detecting changes in the flow of said charges including a first gate electrode that emanates an electric field that renders said buried channel narrower and thus reduces the depth of the buried channel within said first layer when said first gate electrode is connected to a biasing voltage, and a second gate electrode disposed adjacent to said first electrode for detecting changes in the charge flow in the first semiconductor layer beneath said floating gate assembly, wherein said first gate electrode also detects changes in said charge flow when it is disconnected from said biasing voltage; and
 a potential well control gate means disposed between said resistive gate means and said floating gate assembly for neutralizing a charge accumulating potential well that would otherwise occur between said resistive gate and said floating gate assembly.

21. A floating gate semiconductor device operable in either an enhanced transit speed mode or an enhanced responsivity mode, comprising:
 a layer of semiconductor material including a drain means at one end for receiving a flow of charges, and a buried channel that directs said flow of charges along a selected depth within said first layer;
 a resistive gate disposed over a first portion of said layer of semiconductor material for biasing said charges toward said drain means;
 a floating gate assembly disposed over a second portion of said layer of semiconductor material for detecting changes in the flow of said charges, including a first gate electrode for selectively emanating an electric field that changes the width of the buried channel and heance varies the depth of the buried channel within said layer when a biasing voltage is applied thereto, and a second gate electrode adjacent to the first gate electrode for detecting changes in the flow of said charges, and
 a potential well control gate means disposal between the resistive gate and the floating gate assembly for neutralizing a potential well that exists between said floating gate assembly and said resistive gate.

* * * * *